United States Patent
Versari et al.

(10) Patent No.: US 7,400,281 B2
(45) Date of Patent: Jul. 15, 2008

(54) REGULATOR OF A DIGITAL-TO-ANALOG CONVERTER AND RELATED CONVERTER

(75) Inventors: Roberto Versari, Forli (IT);
Massimiliano Mollichelli, Arcore (IT);
Nicola Del Gatto, Torre del Greco (IT);
Nicola Rosito, Corato (IT); Emanuele Confalonieri, Milan (IT)

(73) Assignee: STMicroelectronics, s.r.l, Agrate Brianza (IT)

( * ) Notice: Subject to any disclaimer, the term of this patent is extended or adjusted under 35 U.S.C. 154(b) by 0 days.

(21) Appl. No.: 11/681,659

(22) Filed: Mar. 2, 2007

(65) Prior Publication Data
US 2007/0210949 A1    Sep. 13, 2007

(30) Foreign Application Priority Data
Mar. 3, 2006    (EP)    .................... 06425144

(51) Int. Cl.
*H03M 1/10* (2006.01)
(52) U.S. Cl. ...................... 341/120; 341/144
(58) Field of Classification Search ................. 341/144, 341/120, 118; 327/538; 324/601, 607
See application file for complete search history.

(56) References Cited

U.S. PATENT DOCUMENTS

| | | | |
|---|---|---|---|
| 3,997,892 A | 12/1976 | Susset | |
| 5,764,174 A | 6/1998 | Dempsey et al. | |
| 5,797,964 A * | 8/1998 | Carlson et al. | ................ 607/2 |
| 2005/0189983 A1 | 9/2005 | Sivero et al. | |
| 2006/0217079 A1* | 9/2006 | Yu et al. | ....................... 455/78 |

OTHER PUBLICATIONS

Mijanovic Z. et al., R/2R+ Digital-Analog Converter (DAC), IEEE Instrumentation and Measurement Technology Conference, Brussels, Belgium, Jun. 4-6, 1996.

\* cited by examiner

*Primary Examiner*—Peguy JeanPierre
(74) *Attorney, Agent, or Firm*—Lisa K. Jorgenson; E. Russell Tarleton; Seed IP Law Group PLLC

(57) ABSTRACT

A regulator for a digital-to-analog converter having in input a digital signal and suitable for providing an analog signal in output, the regulator including at least one pair of buffers having in input the digital signal and the outputs connected to a pair of circuit branches connected to the output of the regulator; each of the at least two circuit branches having at least one resistance. To at least one of the at least one pair of buffers a variable resistance is associated, and the regulator includes a circuit having in input the analog signal and adapted for measuring its waveform and acting on the variable resistance in response to its possible anomalous waveform compared to a desired waveform.

24 Claims, 5 Drawing Sheets

REGULATOR OF A DIGITAL-TO-ANALOG CONVERTER AND RELATED CONVERTER

BACKGROUND OF THE INVENTION

1. Field of the Invention

The present invention pertains to regulators for digital-to-analog converters and related converters.

2. Description of the Related Art

Digital-to-analog converters are generally known and are used in various fields, such as for example for programming memory cells and in particular for programming Flash-type memories.

In this case the converters must have the requirements of high linearity and independence from temperature and feed voltage. In the case of Flash-type multi-level memories produced with CMOS technology, it is necessary to apply a fixed voltage to the drain of the cells while the gate terminal must be polarized with a controlled ramp voltage that varies by steps. To obtain very narrow distributions it is necessary that the steps of the ramp are well controlled and a check is made after each step in order to know whether the cell has reached the desired threshold voltage. Furthermore the magnitudes that vary less with temperature and the feed voltage in an integrated circuit are the reference voltage and the ratios of the resistances. For the reasons explained above, an R-2R type digital-to-analog converter is often used, making it possible to obtain much better controlled voltage steps and to produce in output a voltage proportional to the decimal value of the digital signal in input.

The regulator of an R-2R type digital-to-analog converter is shown in FIG. 1. In the regulator the output voltage is proportional to a ratio of resistances for the internal reference voltage of the device, which is the bandgap voltage $V_{BGAP}$; in this way the voltage steps are independent from the temperature and the feed voltage. The regulator in FIG. 1 has seven buffers 1 having in input a digital data item BUS<i>with i=0 ... 6, that is zero or one, being part of a digital word in input to the regulator. The buffers 1 are fed by the bandgap voltage $V_{BGAP}$ and the outputs are connected to each other by resistive branches 11-17 having resistances R of equal value in order to obtain an output $$OUT = \sum_{i=0...6} (2^i * BUS<i> * V_{BGAP})/128$$

where $V_{BGAP}$ is normally the reference voltage of a Flash memory; therefore the converter provides a voltage externally proportional to the decimal value of the digital bus in input. The output OUT is amplified, obtaining the output Vp of the converter, and sent as input to the gate terminal of CMOS type memory cells. The circuit branch 11 is connected through two resistances in series of value R to the earth GND.

The various steps needed to program the cells are obtained by increasing the digital word BUS<6:0> entering the regulator by one digital datum; after each increase a check is made to exclude the cells that have reached the desired voltage threshold Vtprog, for example set to 4 Volt, and the process continues until all the cells are programmed to the desired value. With each increase of the digital word there is in first approximation the variation of the Flash cell's threshold equal to the value of the step itself Vstep, set for example to 0.07V. For this reason it is important that all the steps generated by the regulator are uniform in any operating condition so that the Flash cell is programmed in a uniform controlled way. The voltage steps in output from the converter, which comprises the regulator in FIG. 1, that differ from the value Vstep by an amount greater than a predetermined value ΔOff (for example equal to ±15 mV) make the programming of the cells non-uniform and contribute to broadening the programmed distributions, with consequent degradation of the multi-level Flash memory's reliability.

Said converter is subject to problems when there are changes in the most significant bits of the BUS in input since small differences between the resistances of the most significant branches are sufficient to obtain anomalous steps in the output. For example, a variation of 0.5% in one of the resistances of branch 17 is sufficient to produce a variation of 16% compared to the value expected for the OUT signal when there is an increment in the BUS<6> from the value 0 to the value 1.

FIG. 2 is a graph of the magnitude of the voltage steps Vp in output from the converter of the regulator in FIG. 1 which must be sent to the memory cells of a multi-level Flash NOR device. From the graph it can be seen that there are anomalous steps corresponding to the changes in BUS<6> and BUS<5> and BUS<3>, so corresponding to said changes the voltage steps exceed the desired value Vstep by a quantity ΔOff, with ΔOff=15 mV. Therefore the anomalous voltage steps occur in the case of the most significant bits since a variation in a resistance in one branch has repercussions on successive branches and not the preceding ones.

BRIEF SUMMARY OF THE INVENTION

In view of the foregoing, the present invention provides a regulator for a digital-to-analog converter that overcomes the problems mentioned above.

In accordance with one embodiment, this is achieved by means of a regulator for a digital-to-analog converter having a digital signal in input and being suitable for providing an analog signal in output, the regulator including at least one pair of buffers having in input the digital signal and the outputs connected to a pair of circuit branches connected to the output of the regulator, each of the at least circuit branches having at least one resistance, and they include a variable resistance associated with at least one buffer of the at least one pair of buffers and circuit to measure in input the analog signal and suitable for measuring its waveform and acting on the variable resistance in response to its anomalous waveform compared to the desired waveform.

In accordance with another embodiment, a circuit is provided that includes at least two circuit branches coupled to an output terminal, each circuit branch having first and second series-coupled buffers, the first buffer having a digital signal input, and at least one resistance coupled between an output of the second buffer and the output terminal, at least one branch including a variable resistance coupled between the at least one resistance and the output of the second buffer, and a calibration circuit coupled to the variable resistance.

In accordance with another embodiment, a regulator for a digital-analog converter that receives on an input a digital signal and outputs an analog signal, the regulator including at least two circuit branches coupled to an output terminal, each circuit branch including first and second series-coupled inverters, the first inverter having an input to receive the digital signal, and at least one resistance coupled between an output of the second inverter and an output of the branch; a variable resistance coupled between the at least one resistance and the output of the second buffer in the second circuit branch, and a calibration circuit coupled to the variable resistance, the calibration circuit receiving on an input the analog output signal from the converter; and a second resistance coupled between the outputs of the at least two circuit branches and a resistance branch coupled between ground and the output of the first circuit branch.

BRIEF DESCRIPTION OF THE SEVERAL VIEWS OF THE DRAWINGS

The characteristics of the present invention will appear evident from the following description of an embodiment thereof, illustrated as non-limiting example in the enclosed drawings, in which.

DETAILED DESCRIPTION OF THE INVENTION

Figure 1:
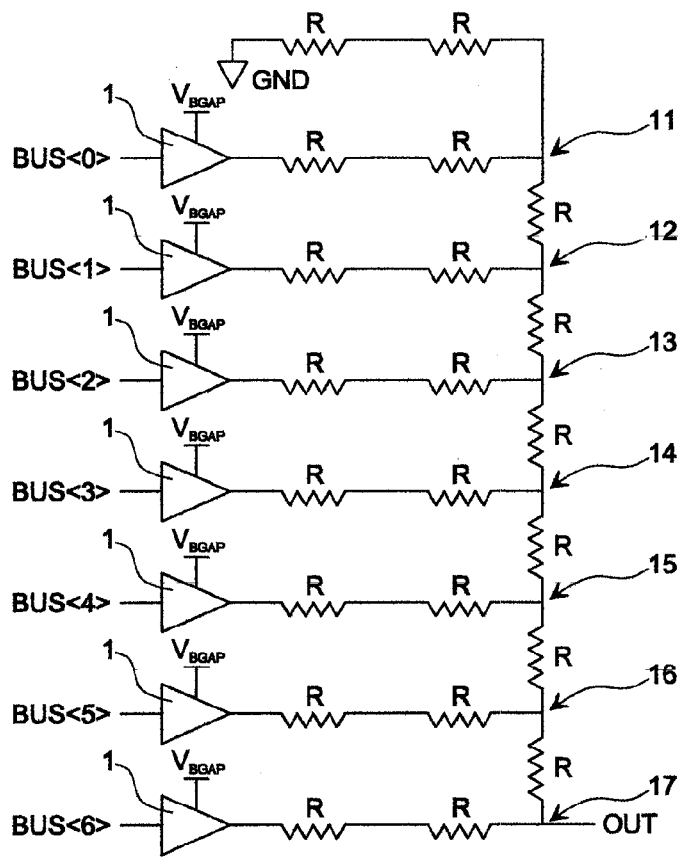
FIG. 1 is a circuit diagram of the regulator of a digital-to-analog converter in accordance with known technique.
Figure 2:
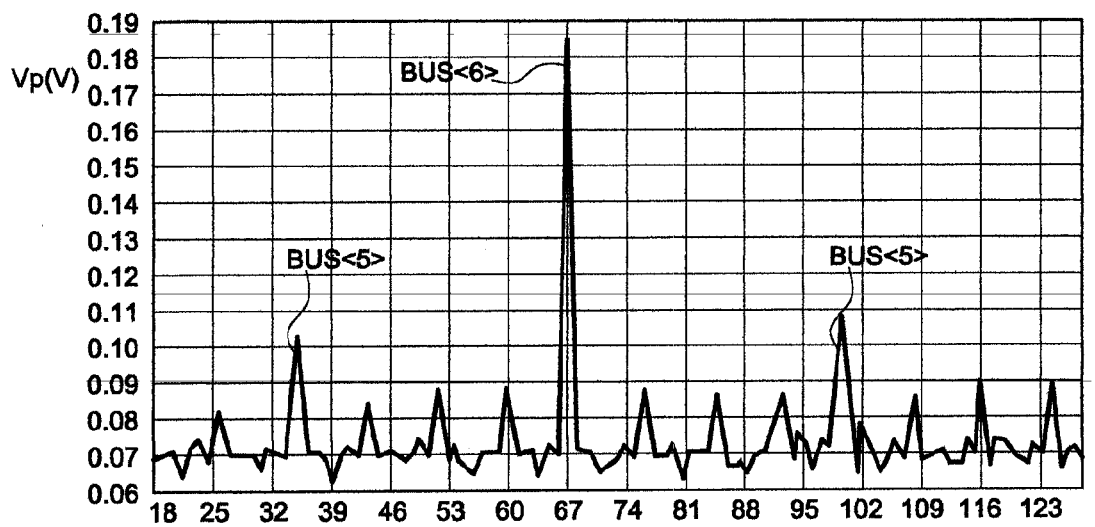
FIG. 2 is a diagram of the voltage steps in output from the converter of the regulator in FIG. 1.
Figure 3:
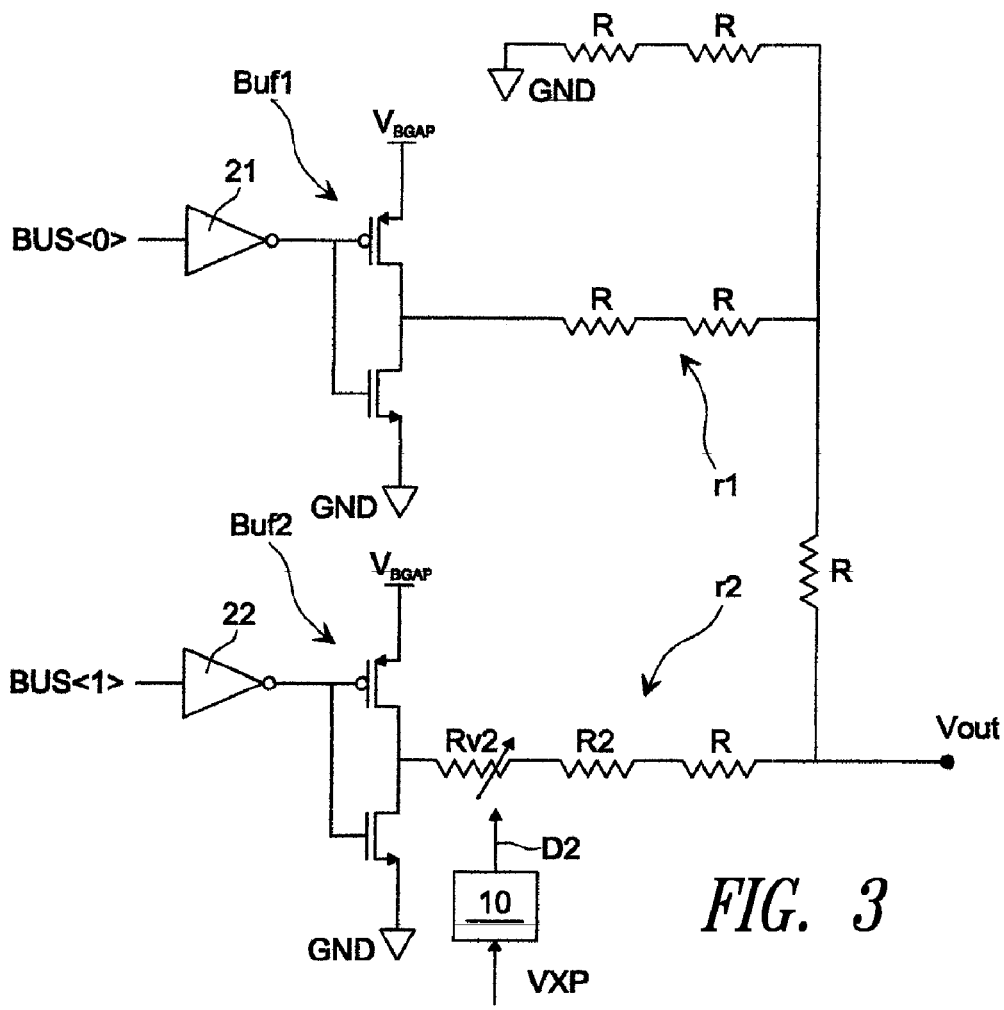
FIG. 3 is a diagram of a regulator for a digital-to-analog converter in accordance with the present invention with only two circuit branches.

FIG. 3 shows a regulator of the digital-to-analog converter in accordance with this invention. The regulator includes at least two resistive branch circuits r1, r2 having in input a signal or digital word BUS<i> with i=0.1. The regulator comprises two buffers Buf1, Buf2 for the circuit branches r1 and r2. A variable resistance Rv2 is associated with the buffer Buf2 so as to compensate for any difference between the nominal values of the resistances of the circuit branches r1, r2 (nominal value equal to 2 R), which produces an anomalous signal waveform Vout in output from the regulator, in order to have an ideal voltage step in correspondence with the transition of the bit corresponding to the digital signal in input. The variable resistance must be appropriately driven by a device 10 having in input a voltage proportional to the voltage Vout in output from the regulator, which is the voltage VXP in output from the converter.

Figure 5:
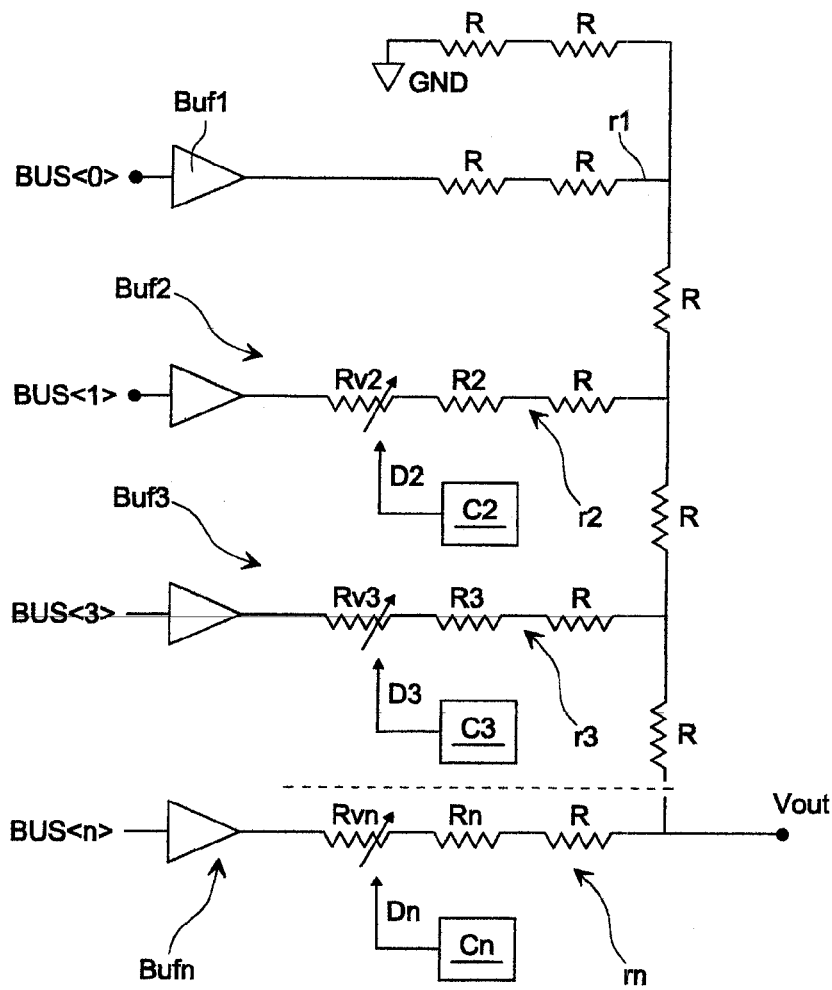
FIG. 5 is a diagram of a regulator for a digital-to-analog converter in accordance with this invention with n circuit branches.

The Rv2_average can represent the nominal value of the resistance Rv2 or the value that the resistance Rv2 must have before its calibration, so that for example before the calibration the total resistance of the branch r2 is 2R. In the case of regulators with n circuit branches as shown in FIG. 5, each buffer Bufi with i=2 . . . n associated with a corresponding circuit branch ri with i=2 . . . n will have its variable resistance Rvi with i=2 . . . n. The various resistances Rv of each branch will be calibrated in succession starting with the resistance Rv2 of the circuit branch r2, which is the branch that has the least significant bit in input to the resistance Rvn of branch rn, which is the branch that has the most significant bit of the digital word in input to the regulator. The regulator with n branches has in input a digital word BUS<i> with i=0, . . . n.

In more detail, FIG. 3 shows a digital-to-analog regulator of the type R-2R with only two branches r1 and r2, two buffers Buf1 and Buf2 and a two bit digital BUS in input. The buffers Buf1 and Buf2 are each made by means of an inverter with a PMOS transistor and an NMOS transistor; the inverter is located between a reference voltage independent of temperature $V_{BGAP}$ and the earth GND. Each input has an inverter port NOT 21, 22 to invert the digital data in input. The buffer Buf2 comprises a variable resistance Rv2 connected between the output of the inverter and the resistive circuit branch r2 and is controlled by a signal D2 coming from the device 10. The two branches r1 and r2 are connected to each other through a resistance R. A block C2 and the resistance R2=R−Rv2_average are associated with the resistance Rv2.

More generally in the case of a regulator with n circuit branches, associated with each resistance Rvi, there is a digital block Ci that memorizes the k bits (con k≧2) necessary to configure the resistance. The calibration of the resistance Rvi consists of determining the optimum configuration of the bits memorized or stored in Ci (that configure the value of Rvi so as to minimize the anomalous voltage steps of the converter based on the regulator of FIG. 5, which are the differences between the resistance values of the branch ri and the preceding branches).

Figure 4:
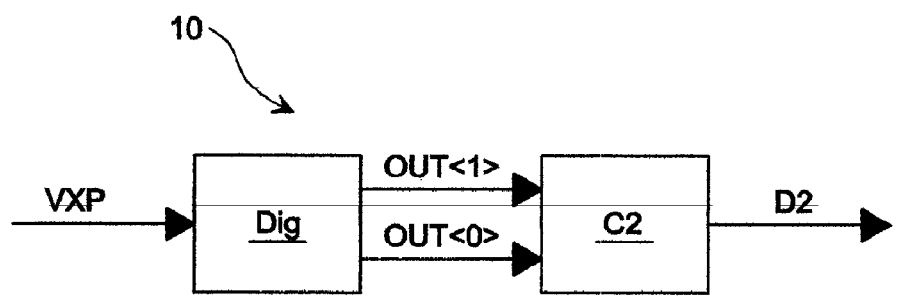
FIG. 4 is a diagram of a device which is a part of the regulator in FIG. 3.

The device 10 is more clearly shown in FIG. 4; the device having in input the signal VXP which is proportional to the signal Vout in output from the regulator. The device 10 comprises a digital device Dig having in input the signal VXP and which is configured to provide in output two digital signals OUT<1>, OUT<0> that indicate whether the resistance Rvi of the branch ri is to be increased, left at the current value, or decreased by a certain value. These signals act on the block Ci associated with the resistance Rvi of the branch ri. When the resistance is to be left unaltered, Ci maintains the current configuration. When the resistance is to be increased/decreased by a given value, the configuration bits stored in the block Ci are modified so as to obtain the desired increment/decrement. Each block Ci comprises a comparator suitable for comparing the signals in output from the device Dig.

The first branch of the regulator in which it is logical to insert a variable resistance Rvi may be determined by means of the following circuit simulation. Starting with the circuit branch associated to the least significant bit of the regulator (in FIG. 5 branch r1) and proceeding towards the most significant bit (in FIG. 5 branch rn), the resistance 2R of the branch is varied by an amount +5%. As soon as a variation in the corresponding step in output from the converter having the regulator is obtained that is greater than the tolerance ΔOff desired (for example 15 mV), a variable resistance, having a central value before the regulation equal to Rvi_average is inserted in the corresponding branch ri and two possible regulation values: Rvi_average+2R*0.05 and Rvi_average−2R*0.05 (one step rising and one falling so as to compensate for the 5% variation). The block Ci is associated with this resistance and has stored within or stores the two bits that decide which of the three configurations is the best. Before calibration, Ci stores in memory the default configuration, which is Rvi=Rvi_average. Once the first branch ri in which it is necessary to insert a variable resistance with its associated block C has been identified, in all the branches r(j) with j>i variable resistances are inserted with their respective blocks C(j) according to the following scheme: in branch r(i+1) a variable resistance Rv(i+1) is included with a central value before calibration equal to Rvi_average and 4 possible calibration values, two rising (Rvi_average+2R*0.025 and Rvi_average+2R*0.05) and two falling, always with the predetermined value or step 2R*0.025. The corresponding block C(i+1) stores three configuration bits that select one of 5 possible values of Rv(i+1). In the branch r(i+2) we will have a variable resistance Rv(i+2) with pre-calibration value equal to Rvi_average and 8 possible calibration values, 4 rising and 4 falling, with steps of 2R*0.0125. The block C(i+2) stores 4 configuration bits to choose one of the 9 possible values of Rv(i+2).

Proceeding in the same way each successive branch will have twice the number of possible calibration steps where each step will be half that of the preceding branch. This possible criterion of choice of the calibration steps of the variable resistances to be placed in the various branches makes it possible to obtain a good occupation of area and at the same time to calibrate accurately all the steps of the regulator comprising the higher ones. Therefore in the case of a regulator with n circuit branches, of these n branches, m (with m<n) branches will each have its own variable resistance Rvi with its own block Ci that stores or has stored therein its best configuration, which differs from branch to branch. The value of m is equal to n−i+1, where i is the first branch (starting with the least significant one) in which a variation of 5% in the resistance 2R produces a variation of the steps in output from the converter greater than the tolerance desired ΔOff.

Returning to the regulator of FIG. 3, the variable resistance Rv2 of the circuit branch r2 is controlled by the k ($\geq$2) configuration bits stored in block C2. The block C2 is driven by the signals OUT<1> and OUT<0> coming from the device Dig. The branch r1 includes two resistances, while the branch r2 has one resistance R-Rv2_average and one resistance R, where Rv2_average is the nominal value of Rv2 before calibration.

Figure 7:
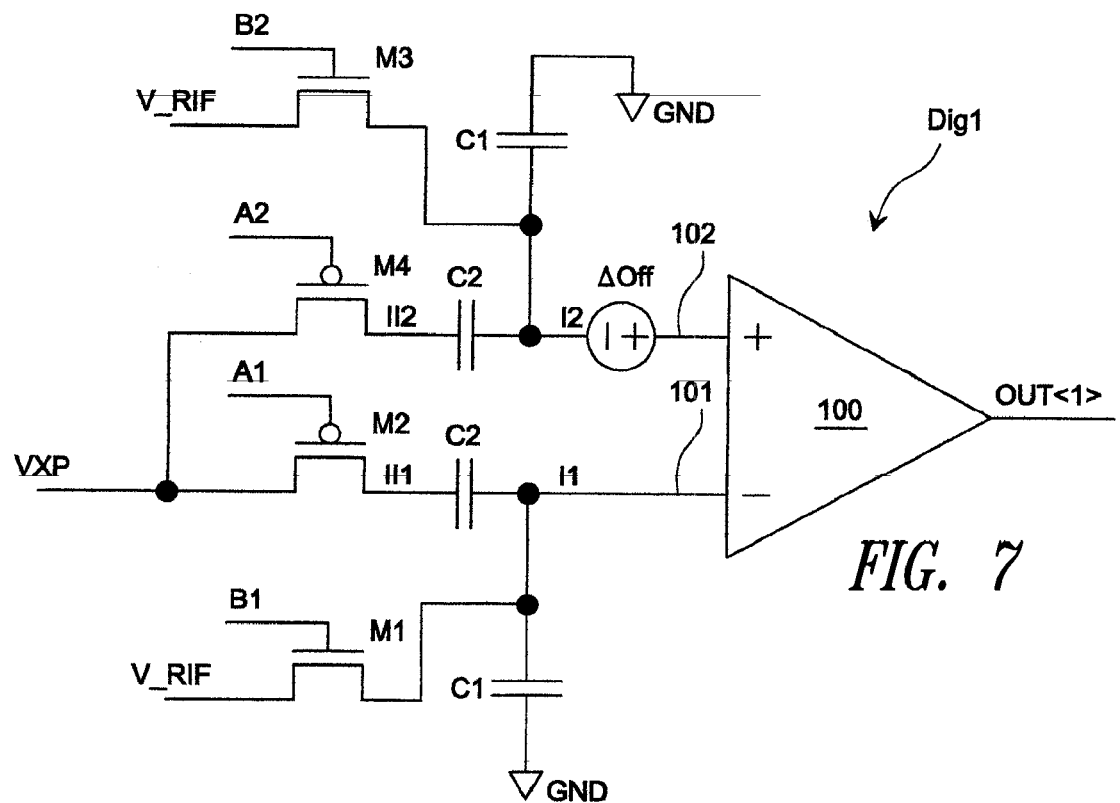
FIG. 7 is a part of the device in FIG. 4.
Figure 8:
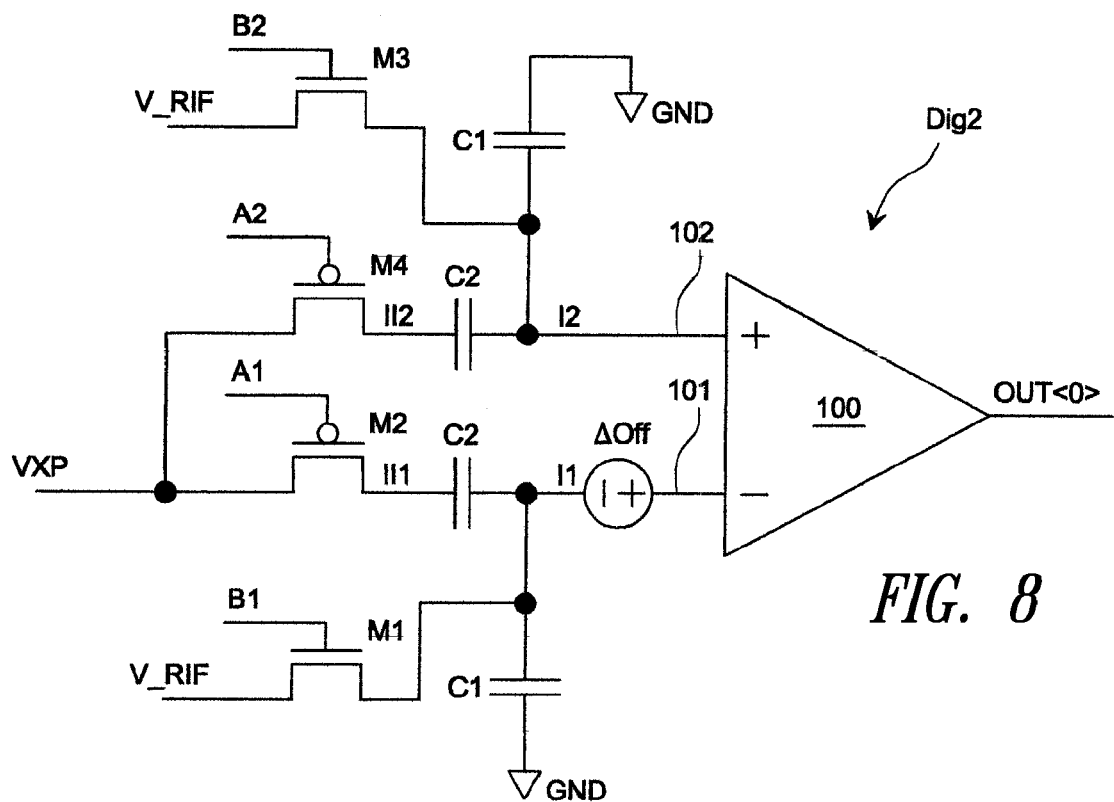
FIG. 8 is another part of the device in FIG. 4.

The device Dig is better shown in FIGS. 7 and 8. Said device has two differential amplifiers Dig1, Dig2 based on a charge partition approach and suitable for producing the respective signals OUT<1>, OUT<0>.

The device Dig1 (FIG. 7) includes a first circuit branch 101 connected to the inverting input terminal of an operational amplifier 100; the inverting terminal coincides with the node I1 which is connected to a terminal of a capacitor C1 having the other terminal connected to earth, to a non-drivable terminal of transistor NMOS M1 having the other non-driving terminal connected to a reference voltage V_RIF and the drivable terminal connected to a voltage B1, to a terminal of a capacitor C2 having the other terminal II1 connected to a non-drivable terminal of a transistor PMOS M2 having the other non-drivable terminal connected to the voltage VXP and the drivable terminal connected to the voltage A1. The voltage V_RIF is a fixed voltage of polarization derived from the voltage $V_{BGAP}$.

The device Dig1 comprises a second branch circuit 102 connected to the non-inverting input terminal of the operational amplifier 100; an offset voltage ΔOff connected to the node 104 is connected to the non-inverting terminal. The node 104 is connected to the terminal of a capacitor C1 having the other terminal connected to earth GND, to a non-drivable terminal of a transistor NMOS M3 having the other non-drivable terminal connected to the reference voltage V_RIF and the drivable terminal connected to a voltage B2, a terminal of a capacitor C2 having the other terminal II2 connected to a non-drivable terminal of a transistor PMOS M4 having the other non-drivable terminal connected to the voltage VXP and the drivable terminal connected to the voltage A2. The operational amplifier 100 produces in output a signal OUT<1>.

The device Dig2 (FIG. 8) is similar to device Dig1, but in this device the offset voltage ΔOff is located in the first circuit branch between the inverting terminal of the operational amplifier 100 and the node I1. In this way we have OUT<1>=1 if the voltage I2+ΔOff>I1 and OUT<0>=1 if the voltage I2−ΔOff>I1. The offset voltage ΔOff must not be so small as to be comparable with the process voltage and not so large as to limit the accuracy of the calibration of the steps of the DAC; said voltage can have a value between 10 and 15 mV.

The functioning of the device Dig, consisting of devices Dig1, Dig2, in accordance with an algorithm for calibration of the buffer Buf2 is as follows and is outlined in FIG. 9.

In an initialization phase 200, let B1=B2=1 and A1=A2=0; so that at the nodes I1 and I2 there is a voltage V_RIF while at nodes II1 and II2 there is a voltage VXP=VXP(0)=0V with BUS<i>=00.

In the next phase 201, keep A1=A2=0 and B2=1 and change B1 to B1=0; in this way the node I1 keeps a high impedance and constant value V_RIF.

In the next phase 202, keeping the values of A1, A2 and B1, B2 from the preceding phase, the signal in input to the regulator BUS<i> is increased by one bit so that BUS<i>=01. By capacitive coupling, and since C2>10*C1, the voltage on the node I1 will rise by a factor Vinc proportional to the value of the increase VXP(1)−VXP(0) while the voltage at the node I2 remains at the value V_RIF. Also, VXP=VXP(1)=0.07V since for every digital word increment bit in input there is an increase of 0.07V in the output voltage VXP.

In the next phase 203, let A1=1, unlike in the preceding phase; in this way the nodes II1 and I1 are isolated from the voltage VXP and the voltages in these nodes are respectively VXP(1) and V_RIF+Vinc.

Then in phase 204, let B2=0, isolating the node I2 at the value V_RIF.

Then in the phase 205, the BUS<i> signal is increased with BUS<i>=10 to bring the node 112 to the new value of VXP=VXP(2)=0.14V. The nodes II1 and I1 remain at the value of the preceding phase while the voltage at the node I2 will rise by an amount Vinc2 proportional to the increase VXP(2)−VXP(1).

In the next phase 206, let A2=1, so as to isolate the node II2. The voltages at the nodes I1 and I2 are respectively V_RIF+Vinc and V_RIF+Vinc2.

The outputs of the two devices Dig1 and Dig2 may assume different values. The outputs OUT<1> and OUT<0> are sent to the block C2 for possible modification of the configuration bits associated with the resistance Rv2 to be calibrated.

For example, OUT<1>=0 and OUT<0>=0; in this case, I2+ΔOff<I1, which means that Vinc2−Vinc<−ΔOff, or |Vinc2−Vinc1|>ΔOff, and the difference in the absolute value between the two increments is greater than ΔOff. Therefore VXP(2) must be increased, which means increasing the resistance of the branch r2, thus varying suitably the resistance Rv of the buffer Buf2 and repeating the measurement from phase 200. The bits stored in block C are modified to increase the resistance Rv of the buffer Buf2 by one step, for example of the value 2R*0.0125.

Moreover, when OUT<1>=1 and OUT<0>=1, then I2−ΔOff>I1. This means that Vinc2−Vinc1>ΔOff, and the difference between the two increments is greater than ΔOff. Therefore VXP(2) must be decreased, this means lowering the resistance of the branch r2, thus varying suitably the resistance Rv of the buffer Buf2 and repeating the measurement from phase 200. The bits stored in block C2 are modified to reduce the resistance Rv of the buffer Buf2 by one step for example 2R*0.0125.

Also, when OUT<1>=1 and OUT<0>=0, then I1+ΔOff>I2>I1−ΔOff. This means that |Vinc2−Vinc|<ΔOff, and the difference in absolute value between the two increments is less than ΔOff. Therefore the voltage steps [VXP(2)−VXP(1)] and [VXP(1)−VXP(0)] differ by less than offset voltage ΔOff, and it is not necessary to vary the resistance Rv of the buffer Buf2. The bits stored in the block C2 are not modified and the calibration of the buffer Buf2 finishes correctly.

The situation in which OUT<1>=0 and OUT<0>=1 is impossible.

Figure 6:
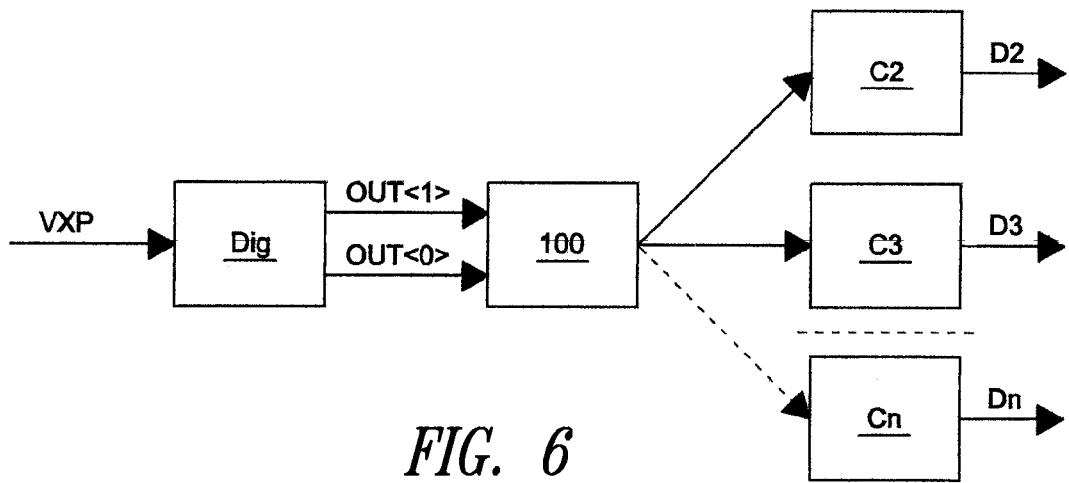
FIG. 6 is a diagram of a device which is part of the regulator in FIG. 5.

In the case of the regulator in FIG. 5, once the calibration of the buffer Buf2 has been done, the block Dig is disconnected from the block C2 related to the resistance Rv2 of the buffer Buf2 (that stores the optimum configuration of the resistance Rv2 of the buffer Buf2 until a possible later calibration is done) and is connected to block C3 of the resistance Rv3 of the next branch of the regulator (FIG. 6). This is made possible by a device 100 suitable for sending the outputs OUT<1> and OUT<0> of the device Dig to the various blocks C1 ... Cn to carry out the calibration of the resistances Rv2 ... Rvn. Then start again with the calibration cycles to determine the optimum configuration of the variable resistance Rv3 of the branch r3 and so on for all the other branch circuits. It should be noted that each block Ci can store the optimum configuration bits in RAM cells (and in this case it will be necessary to carry out a preliminary calibration procedure every time the device is switched on) or in non-volatile Flash cells in which case the calibration is done once and for all the first time it is switched on and never needs to be repeated.

Therefore for the calibration of each buffer of the regulator in FIG. 3 as a maximum, a number of cycles is necessary, where each cycle goes from phase 200 to phase 206, equal to the number of possible steps of the resistance rising or falling. A complete cycle requires about 70 us to be carried out (10 us on average for each phase).

Since the anomalous voltage steps occur in the case of the most significant bits because a variation on the resistance of a branch affects successive branches and not preceding ones, in the case of a regulator with n branches the calibration algorithm will therefore start from the buffer of the branch with the variable resistance associated with the circuit branch with in input the least significant bit of the digital word in input, for example, branch r2. To calibrate this buffer a single complete calibration cycle is necessary, because its resistance Rv2, as stated previously, can be varied by a single rising or falling step. Once the buffer has been calibrated, the final configuration value of the resistance Rv2 is stored in the block C2 and the device Dig is disconnected from the buffer of the branch 2 and applied to the buffer of the next branch r3, whose resistance can be varied by 2 rising of falling steps. For the branch r3 two calibration cycles are therefore needed as a maximum; and so on for each successive branch the maximum number of cycles required doubles compared to the number for the previous branch in order to maintain the same level of calibration accuracy.

In conclusion, if m buffers are calibrated in a regulator with n>m branches, the maximum number of cycles required is $N=1+2+4+\ldots+2^{m-1}=2^m-1$. For example, for the regulator of FIG. 5 with n=7 branches, it is sufficient to calibrate the branches r4, r5, r6 and r7, making a total of m=4 branches to be calibrated. The total time for a complete calibration of the regulator is therefore $(2^m-1)*70$ us=15*70 us=1 s approx., an acceptable time in the case in which the calibration is done in the testing phase once and for all the first time the device is switched on.

There may be extreme cases, such as when a value of the resistance Rv of the buffer capable of correcting the step within the desired tolerance limits does not exist. All the calibration cycles possible on the resistance Rv in question are carried out, reducing the error on the step in each cycle. At the end the error will be the minimum possible for the buffer considered, although not lying within the desired tolerance.

It is also possible for the increments of the resistance Rv of the buffer to be too high compared to the resolution desired when passing from a voltage step too low to a voltage step too high; in this case the buffer is considered calibrated. The problem just mention can be avoided so as to avoid variations in the resistance Rv that do not cause a variation higher than 2*ΔOff in the related voltage.

In the calibration algorithm sequence of the buffers, a calibration is first done on the buffer related to the least significant bit of the digital word and then the others related to the most significant bits since the fact of changing the resistance of a circuit branch has effects on the voltage steps related to the circuit branches associated with the most significant bits but the reverse does not happen.

Alternatively, when using two devices Dig1 and Dig2, the device Dig may include only the device Dig1 in which, to calculate the value OUT<0>, the calibration cycle is repeated exchanging the voltage signals A1, B1 with the signals A2, B2.

If only one device Dig1 is used, the output OUT<1> is calculated after the first cycle, it is stored, and a second cycle is done in which the value OUT<0> is calculated, exchanging the voltage signals A1, B1 with the signals A2, B2. The phase 205, which is the valuation phase, does not occur at the end of each cycle but once every two cycles. Therefore when using only one device Dig1, the time needed for calibration is doubled.

The resistance Rv of each buffer of the regulator in accordance with the invention can consist of a natural transistor of suitable dimensions.

Figures 9, 10:
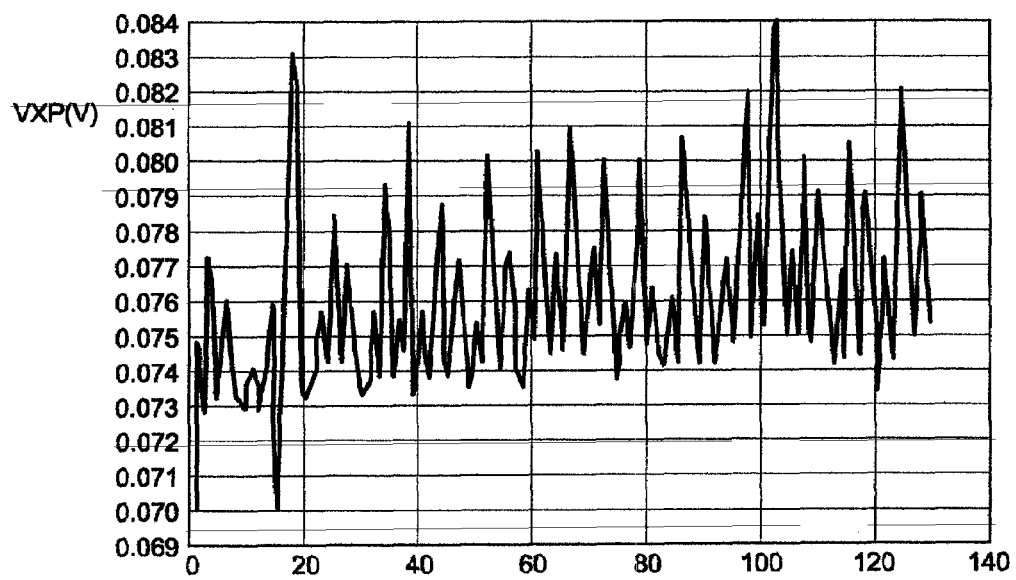
FIG. 9 is a diagram of the signals involved in the device in FIG. 4.
FIG. 10 is a diagram of the voltage steps in output from the regulator in FIG. 5 in the case of seven circuit branches.

FIG. 10 shows a graph of the voltage steps in output from the regulator in FIG. 5 in accordance with the invention. Note that the voltage VXP does not have anomalous steps. Once the calibration has been done, the various blocks Ci associated with each resistance maintain the optimum configuration values set until a possible later calibration.

The invention claimed is:

1. A regulator of a digital-to-analog converter having in input a digital signal and being suitable for providing an analog signal in output, the regulator comprising: at least one pair of buffers having in input said digital signal and outputs connected to a pair of circuit branches that are connected to the output of the regulator, each of said at least two circuit branches comprising at least one resistance, a variable resistance associated with at least one buffer of said at least one pair of buffers, and means having in input said analog signal and adapted to measure the analog signal waveform and acting on said variable resistance in response to an anomalous waveform of said analog signal compared to the desired waveform.

2. The regulator of claim 1, wherein said means is suitable for acting on said variable resistance if with two successive increments by one bit of the digital signal in input, the difference between the values of the corresponding increments of said analog signal exceeds in absolute value a reference value.

3. The regulator of claim 2 wherein said means comprises at least one differential amplifier of the charge partition type, said amplifier adapted to provide a first output signal and a second output signal, and other means associated with each variable resistance and having in input said first output signal and second output signal of the differential amplifier and suitable for acting on the variable resistances in response to the values assumed by said first output signal and second output signal of the at least one differential amplifier.

4. The regulator of claim 3, wherein said other means comprise memory for storing the bits suitable for the configuration of the associated variable resistance.

5. The regulator of claim 4, wherein said other means comprise a further means of memory in which a group of predetermined resistance values are stored, said first output signal and second output signal from at least one differential amplifier acting on said other means to chose a value of said group of resistance values of said further means of memory for the configuration of the associated variable resistance.

6. The regulator of claim 3, wherein said means comprise two differential amplifiers of the charge partition type suitable for providing said first signal and second signal.

7. The regulator of claim 6, comprising a single amplifier suitable for providing said first signal on a first occasion and a second signal on a second occasion, said differential amplifier comprising a reference value at said non-inverting terminal, said means comprising means for storing said first signal.

8. The regulator of claim 3 wherein said at least one differential amplifier of the charge partition type comprises an operational amplifier coupled to the inverting terminal of which are associated first means suitable for producing at said inverting terminal a signal proportional to a first increment in the analog signal due to a first increment by a bit of the digital signal in input and to the non-inverting terminal of which is associated second means capable of producing a signal proportional to a second increment in the analog signal due to a second increment by one bit of the digital signal in input, said second increment of the input signal being successive to the first increment.

9. The regulator of claim 8, wherein the differential amplifier is configured to provide the first signal comprising a reference value at said non-inverting terminal and the differential amplifier suitable for providing the second signal comprising a reference value at said non-inverting terminal.

10. The regulator of claim 1, comprising a number of buffers and circuit branches equal to the number of bits of the digital signal in input, each buffer and each respective circuit branch having a bit of said digital signal in input, and wherein said means is adapted to act on the variable resistance associated with the buffer in which a transition of the type of input bit has occurred.

11. The regulator of claim 1, wherein the at least one buffer with said variable resistance comprises an inverter located between a reference voltage independent of temperature and earth, the output of said inverter connected to said variable resistance, the output of said variable resistance connected to said resistive circuit branch.

12. The regulator of claim 1, comprising the type R-2 R.

13. A method of calibrating a regulator for a converter of a digital signal into an analog signal, the regulator including at least one pair of buffers having in input said digital signal and the outputs connected to a pair of circuit branches connected to the output of the regulator, each of said at least two circuit branches having at least one resistance, the regulator including a variable resistance associated with at least one buffer of said at least one pair of buffers 1 and said method comprising: measuring the waveform of the analog signal in output from the regulator, and varying the variable resistance in response to an anomalous waveform compared to a desired waveform.

14. The method of claim 13, wherein said measuring of the signal in output from the regulator comprises a measuring of an increment of said analog signal due to an increase in the digital signal in input and measuring the increment of said analog signal due to a successive increment in the digital signal in input, said measuring the variation of the resistance carried out when the difference between the values of the corresponding increments of the analog signal exceeds in absolute value a reference value.

15. The method of claim 14, wherein said regulator comprises a number of circuit branches, with n being a whole number, and a plurality n of buffers of which a plurality m of buffers, with m being a whole number less than n, have a variable resistance associated, said measuring step and varying of the variable resistance step carried out for each variable resistance associated with one of the m buffers.

16. The method of claim 15, wherein said regulator includes means associated with each variable resistance, said means including a group of resistance values for each variable resistance, said measuring step and said varying step associated with a variable resistance being repeated until the resistance value is selected from said group of values so that the difference between the values of the corresponding increments of the analog signal from the regulator does not exceed or approach in absolute value a reference value.

17. A circuit, comprising:
at least two circuit branches coupled to an output terminal, each circuit branch comprising:
first and second series-coupled buffers, the first buffer having a digital signal input, and at least one resistance coupled between an output of the second buffer and the output terminal, at least one of the two circuit branches comprising a variable resistance coupled between the at least one resistance and the output of the corresponding buffer, and a calibration circuit coupled to the variable resistance.

18. The circuit of claim 17, wherein the first and second branches have their outputs coupled together by a second resistance.

19. The circuit of claim 17, wherein the calibration circuit comprises at least one differential amplifier and a memory having stored therein resistance values for controlling the variable resistance.

20. The circuit of claim 17, wherein the first and second buffers comprise first and second inverters, respectively, and the second inverter is coupled between a reference voltage independent of temperature and ground.

21. The circuit of claim 17, further comprising a resistance branch coupled between ground and the output of the first branch.

22. A regulator circuit for a digital-to-analog converter that receives at an input a digital signal and outputs an analog signal, the regulator comprising:
at least two circuit branches coupled to an output terminal, each circuit branch comprising:
first and second series-coupled inverters, the first inverter having an input to receive the digital signal, and at least one resistance coupled between an output of the second inverter and an output of the branch;
a variable resistance coupled between the at least one resistance and the output of the second buffer in the second circuit branch, and a calibration circuit coupled to the variable resistance, the calibration circuit receiving on an input the analog output signal from the converter; and
a second resistance coupled between the outputs of the at least two circuit branches and a resistance branch coupled between ground and the output of the first circuit branch.

23. The regulator of claim 22, wherein the calibration circuit comprises at least one differential amplifier receiving the digital signal and coupled to a memory having stored therein resistance values for controlling the variable resistance.

24. The regulator of claim 23, wherein the at least one differential amplifier comprises an operational amplifier having an inverting terminal at which is produced a signal proportional to a first increment in the analog signal due to a first increment by a bit of the digital signal in input, and producing at the non-inverting terminal a signal proportional to a second increment in the analog signal due to a second increment by one bit of the digital input signal, the second increment being successive to the first increment.

* * * * *

UNITED STATES PATENT AND TRADEMARK OFFICE
CERTIFICATE OF CORRECTION

PATENT NO. : 7,400,281 B2
APPLICATION NO. : 11/681659
DATED : July 15, 2008
INVENTOR(S) : Roberto Versari et al.

It is certified that error appears in the above-identified patent and that said Letters Patent is hereby corrected as shown below:

On the Title Page
Item (73)...Assignee:, "STMicroelectronics, s.r.l, Agrate Brianza (IT)" should read as -- STMicroelectronics S.r.l., Agrate Brianza (IT) --

Column 9
Line 48, "said at least one pair of buffers 1 and said method comprising:" should read as -- said at least one pair of buffers and said method comprising: --

Signed and Sealed this

Thirtieth Day of September, 2008

JON W. DUDAS
*Director of the United States Patent and Trademark Office*